United States Patent [19]

Chinone et al.

[11] Patent Number: 4,881,238
[45] Date of Patent: Nov. 14, 1989

[54] SEMICONDUCTOR LASER HAVING QUANTUM WELL ACTIVE REGION DOPED WITH IMPURITIES

[75] Inventors: Naoki Chinone, Hachioji; Kazuhisa Uomi, Kokubunji; Tadashi Fukuzawa, Tokyo; Hideaki Matsueda, Tokorozawa; Takashi Kajimura, Tokyo, all of Japan

[73] Assignee: Hitachi, Ltd., Tokyo, Japan

[21] Appl. No.: 888,073

[22] Filed: Jul. 22, 1986

[30] Foreign Application Priority Data

Jul. 26, 1985 [JP] Japan ................................. 60-164002
Sep. 13, 1985 [JP] Japan ................................. 60-201543

[51] Int. Cl.[4] .............................................. H01S 3/19
[52] U.S. Cl. ........................................ 372/68; 372/45; 357/16; 357/17
[58] Field of Search ................... 372/68, 45; 357/17, 357/16

[56] References Cited

U.S. PATENT DOCUMENTS

| | | | |
|---|---|---|---|
| 4,577,321 | 3/1986 | Carney et al. | 372/45 |
| 4,599,728 | 7/1986 | Alavi et al. | 372/45 |
| 4,630,083 | 12/1986 | Yamakoshi | 357/17 |
| 4,644,378 | 2/1987 | Williams | 357/17 |
| 4,673,959 | 6/1987 | Shiraki et al. | 357/16 |
| 4,701,774 | 10/1987 | McIlroy et al. | 357/16 |
| 4,706,253 | 11/1987 | Su et al. | 357/17 |
| 4,757,357 | 7/1988 | Varon et al. | 357/17 |
| 4,761,790 | 8/1988 | Hayakawa et al. | 357/16 |

FOREIGN PATENT DOCUMENTS

0133342 6/1984 European Pat. Off. .

OTHER PUBLICATIONS

Mashita et al.; "GaAs-Al$_x$Ga$_{1-x}$As—Epitaxy"; Japanese J. of Appl., Phys. Supplements, 1983 Suppl.; 15th Conf.; pp. 54-55; Tokyo, JP.
Kawamura et al.; "In GaAs—Epitaxy"; Electronic Letters, vol. 20, No. 11, 05/24/1984; pp. 459-460; London, GB.
Patent Abstracts of Japan, vol. 8, No. 221 (E-271) [1658], 9th Oct. 1984; and JP-A-59104191; Fujitsu K.K.; 15-06-1984.
Dingle et al.; "Building Semiconductors—Up"; Bell Lab. Record, vol. 58, No. 8; 09/1980; pp. 274-281; Murray Hill, N.J., U.S.
Tsang et al.; "Current Injection GaAs-Al$_x$Ga$_{1-x}$As Multi-Quantum-Well Heterostructure Lasers Prepared by Molecular Beam Epitaxy"; 11/01/1979; pp. 637-675; Appl. Phys. Lett. 35(9).
Coleman et al.; "High Barrier Cluster Free Al$_x$Ga$_{1-x}$-As-AlAs-GaAs Quantum Well Heterostructure Laser", 01/15/1981; pp. 63-64; Appl. Phys. Lett. 38(2).

Primary Examiner—William L. Sikes
Assistant Examiner—Xuân Thi Vo
Attorney, Agent, or Firm—Antonelli, Terry & Wands

[57] ABSTRACT

In a well-known semiconductor laser, a multiple quantum well type active layer consisting of barrier layers and active layers or well layers, each of which has a thickness less than the de Broglie wavelength of electrons, is doped with an impurity, and the impurity density is made higher in the barrier layer than in the well layer. Further, in a case where the multiple quantum well active layer is held between p-type and n-type cladding layers, the well layer is undoped, the part of the barrier layer lying in contact with the well layer is undoped, and the other part of the barrier layer close to the p-type cladding layer is put into the n-conductivity type while that of the barrier layer close to the n-type cladding layer is put into the p-conductivity type.

51 Claims, 7 Drawing Sheets

SEMICONDUCTOR LASER HAVING QUANTUM WELL ACTIVE REGION DOPED WITH IMPURITIES

BACKGROUND OF THE INVENTION

The present invention relates to semiconductor lasers, and more particularly to the structure of a semiconductor laser featuring a high modulation speed and a low threshold current.

The modulation speed of a semiconductor laser is proportional to the maximum frequency of the modulation of the semiconductor laser. In order to raise the speed of a semiconductor laser, accordingly, the maximum frequency in the direct modulation of the semiconductor laser needs to be rendered as high as possible. Usually, the maximum frequencies in the direct modulation of semiconductor lasers are approximately 5 GHz. Recently, it has been theoretically predicted that the maximum frequency will rise with the so-called quantum well type laser in which the thickness of an active layer is smaller than an electron wave packet within a crystal (Y. ARAKAWA et al.: Applied Physics Letters, 45, 950 (1984)). On the other hand, it has been experimentally verified as to conventional semiconductor lasers that the maximum frequency rises when an active layer is heavily doped with an impurity (C. B. SU et al.: Applied Physics Letters, 46, 344 (1985)). In either case, however, the maximum frequency of the direct modulation is near 10 GHz without any other special contrivance.

In the Record of the 9th Laser Conference, pp. 162–3, it has been disclosed by C. B. SU et al. that the modulatible frequency of a semiconductor laser increases when the impurity concentration of a p-type active layer is raised. This is based on the fact that the increment of a gain coefficient versus the increase of injected carriers is enlarged by impurity doping. This method, however, has had the problem that the lifetimes of the carriers of the active layer shorten to raise the threshold current and to lower the radiation efficiency.

SUMMARY OF THE INVENTION

The present invention has been made in order to eliminate the disadvantages of the prior arts, and has for its object to provide a semiconductor laser exhibiting a low threshold current as well as a high radiation efficiency and capable of direct modulation at or above 10 GHz.

The maximum frequency of the direct modulation of a semiconductor laser is substantially determined by a relaxation oscillation frequency $f_r$. The relaxation oscillation frequency $f_r$ originates from a phase shift in the variations of light and electrons. As a method effective for raising the frequency $f_r$, it is considered to increase the ratio ($\Delta g/\Delta n$) of the increment $\Delta g$ of a gain to the increment $\Delta n$ of a carrier density, that is, a differential gain. It is reported in the Y. ARAKAWA et al. literature mentioned above that the differential gain enlarges with the so-called quantum well type laser in which the thickness of the active layer of the semiconductor laser is reduced so as to be smaller than the wave packet of free electrons within a crystal. On the other hand, it is reported by C. B. SU et al. as stated above that the frequency $f_r$ increases when the active layer of the conventional semiconductor laser is doped with an impurity at a high concentration. This is also considered to be based on the increase of the differential gain by the high concentration of impurity.

The inventors have found out that, in order to increase the speed of modulation by further raising the frequency $f_r$ of the laser such as the quantum well type laser in which the thickness of the active layer is smaller than the wave packet of the free electrons within the crystal, an impurity may be introduced into the active layer which has hitherto been undoped or into two or more active layers as included in the quantum well type laser or a barrier layer located between these active layers, and that, as regards the concentration of the impurity, the impurity needs to be introduced at a concentration higher than the density of carriers which are injected into the active layer in a lasing mode. In this connection, it has been revealed that, when a donor is introduced as the type of the impurity, the two-dimensionality of the electrons is prone to deteriorate to lessen the differential gain, so an acceptor is more effective. Besides, in the multiple quantum well type laser in which the plurality of thin active layers are disposed with the barrier layers interposed therebetween, carriers generated by the impurity with which the barrier layers are doped are trapped by the active layers. It has been revealed that, in this case, a band tail formed by the impurity doping does not deteriorate the two-dimensionality of the electrons or holes and does not lower the differential gain, so the speed of modulation can be increased. That is, in a semiconductor laser wherein the thickness of an active layer is smaller than the wave packet of free electrons within a crystal, a semiconductor laser according to the present invention consists in that the active layer or a barrier layer, the band gap of which is greater than those of at least two active layers included, is doped with an impurity at a density higher than the density of carriers which are injected into the active layer, whereby the relaxation oscillation frequency $f_r$ of the quantum well type laser is raised to heighten the maximum frequency and to increase the speed of modulation.

One of the methods of reducing the threshold current of a semiconductor laser is to put the active layer thereof into a multiple quantum well structure. This is based on the fact that the proportion of carriers contributive to a gain increases owing to a stepped state density caused by the two-dimensionality of carriers. Further, it is generally known that, in the multiple quantum well structure, the increment of the gain versus the increase of injected carriers becomes greater than in a conventional double heterostructure. By doping the multiple quantum well active layer of the multiple quantum well type semiconductor laser into the p-type or n-type, it can be expected that high-speed modulation characteristics will be sharply improved. However, when the doping is performed for the entire multiple quantum well structure, it is feared that active layer where carriers are locally existent will undergo band tailing, by which the two-dimensionality of the carriers will be deteriorated. The inventors have accordingly found out that, when the active layer where the carriers exist is not doped but only a barrier layer is selectively doped, the two-dimensionality of the carriers is not deteriorated, so the high-speed modulation characteristics can be improved (FIG. 4). In the multiple quantum well structure, however, the wave function of electrons or holes penetrates to the barrier layer. The inventors have therefore invented a structure in which, in the barrier layer, several atomic layers lying in contact with the active layer are left undoped, while the central region of the barrier layer is of the p-type or n-type (FIG. 5). Further, it has been found out that, when the central regions of the barrier layers are selectively doped, they are put into the n-type on the side of a p-type cladding layer and into the p-type on the side of an n-type cladding layer as illustrated in FIG. 6. Thus, the active layer is doped in both the p- and n-types, the increment of the gain versus the injected carriers enlarges greatly, and sharp improvements in the high-speed modulation can be expected.

In brief, in a semiconductor laser wherein a semiconductor substrate is formed thereon with at least a cladding layer and an active layer or with at least a multiple quantum well active region in which active layers and barrier layers are alternately stacked and p-type and n-type cladding layers each of which has a band gap greater than that of the active layer, a thickness of the active layer being less than the de Broglie wavelength of electrons; the conductivity types of the constituent semiconductor layers are made spatially different in the stacking direction thereof, whereby a semiconductor laser of high modulation speed has been obtained.

In particular, the conductivity types of the active layers and the barrier layers are different in a direction of stacking the active and barrier layers of the active region.

As described above, a semiconductor laser according to the present invention consists, in a semiconductor laser wherein the thickness of an active layer is smaller than the wave packet of free electrons within a crystal, in that the active layer mentioned above or a barrier layer whose band gap is greater than the thickness of an active layer in the presence of at least two active layers is doped with an impurity at a density higher than the density of carriers which are injected into the active layer, whereby the relaxation oscillation frequency $f_r$ of the quantum well type laser is raised to permit direct modulation at the maximum frequency of or above 20 GHz far exceeding 10 GHz, and to achieve a sharp enhancement in the modulation speed of the semiconductor laser. A further effect is that the semiconductor laser is applicable as a light source for an optical arithmetic circuit or for ultrahigh-speed optical communications.

DETAILED DESCRIPTION OF THE PRESENTLY PREFERRED EMBODIMENTS

Now, embodiments of the present invention will be described with reference to the drawings.

Figure 1:
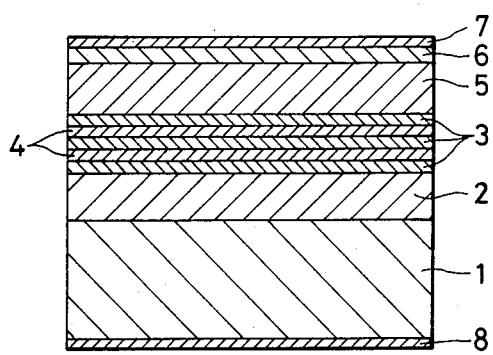
FIG. 1 is a sectional view showing an embodiment of a semiconductor laser according to the present invention.
Figure 2:
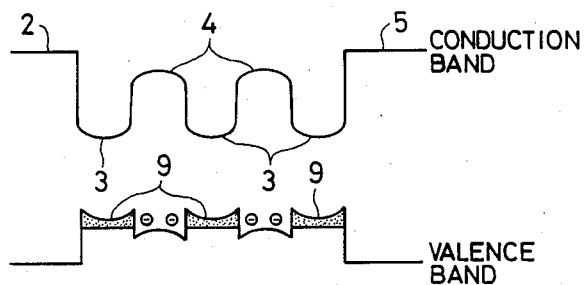
FIG. 2 is a diagram showing the energy bands of a quantum well structure.
Figure 3:
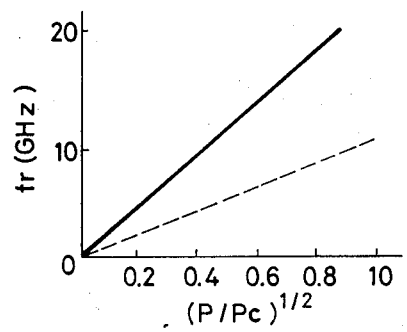
FIG. 3 is a graph showing the experimental results of relaxation oscillation frequencies $f_r$.

Embodiment 1:

FIG. 1 is a sectional view showing Embodiment 1 of a semiconductor laser according to the present invention, FIG. 2 is an energy band diagram of a quantum well structure, and FIG. 3 is a graph showing the experimental results of relaxation oscillation frequencies $f_r$. Referring to FIG. 1, an n-type $Ga_{1-x}Al_xAs$ cladding layer (x=0.45) 2 was grown on an n-type GaAs substrate 1 by the metal-organic chemical vapor deposition, and a multiple quantum well structure was grown thereon. The multiple quantum well layer was such that p-type $Ga_{1-y}Al_yAs$ active layers (y=0-0.2, thickness: 3-15 nm) 3 and undoped $Ga_{1-z}Al_zAs$ barrier layers (z>y, thickness: 3-20 nm) 4 were alternately grown into 2-10 layers. Subsequently, a p-type $Ga_{1-x}Al_xAs$ layer 5 and a p-type GaAs layer 6 were grown, and a p-side electrode of Cr—Au 7 and an n-side electrode of Au—GeNi—Au 8 were evaporated. Then, the resultant structure was cut to individual chips. Here, when the active layers 3 were doped with a p-type impurity of at least $1 \times 10^{18}$ cm$^{-3}$, the differential gain enlarged, and the maximum frequency rose from 10 GHz in the prior art to 20 GHz. When the concentration of the doping impurity exceeds $1 \times 10^{19}$ cm$^{-3}$, lattice defects increase, and hence, the impurity concentration should preferably be restrained to the order of $1 \times 10^{18}$ cm$^{-3}$. In addition, when the active layers are doped with Zn, disordering attributed to diffusion arises, and the quantum well structure can vanish. It is therefore desirable to employ Mg, Be etc., which are more effective.

Embodiment 2:

Another embodiment of the present invention will be described by referring to FIG. 1 similarly. An n-type $Ga_{1-x}Al_xAs$ cladding layer 2 was grown on an n-type GaAs substrate 1 by the metal-organic chemical vapor deposition. In the present embodiment, a multiple quantum well structure formed on the cladding layer 2 was such that undoped $Ga_{1-y}Al_yAs$ active layers (y=0-0.2, thickness: 3-15 nm) 3 and p-type $Ga_{1-z}Al_zAs$ barrier layers (z>y, thickness: 3-20 nm) 4 were alternately grown into 2-10 layers. Here, when the barrier layers 4 were doped with a p-type impurity of at least $1 \times 10^{18}$ cm$^{-3}$, most of created holes were trapped by the active layers 3. An energy band diagram in this case is shown in FIG. 2. High densities of holes 9 exist in the active layers 3 as illustrated in the figure, and as in the foregoing embodiment, the differential gain enlarges to raise the maximum frequency. The experimental results of relaxation oscillation frequencies in the case where the barrier layers 4 were doped with $3 \times 10^{18}$ cm$^{-3}$ of Mg, are shown in FIG. 3. In this figure, the axis of abscissas represents the square root of the optical power P normalized by the catastrophic degradation optical power $P_c$, while the axis of ordinates represents the relaxation oscillation frequency $f_r$. As compared with the data of the quantum well type laser in the prior art indicated by a broken line, the maximum frequency was enhanced above 20 GHz in the present embodiment as indicated by a solid line.

Since, in the present embodiment, the active layer 3 is not directly doped with an impurity, a band tail attributed to impurity doping is not formed, and the two-dimensionality of electrons or holes is not deteriorated in the quantum well structure. Therefore, the differential gain based on the quantum well structure does not lower, and the increase of the speed of direct modulation is ensured more. As the p-type impurity, any of Mg, Be etc. is effective as in the preceding embodiment.

Moreover, in case of this embodiment, not only the p-type impurity but also an n-type impurity such as Si, Te or Se is effective. Further, when in the respective embodiments, the barrier layer is made of InP and the active layer is made of InGaAsP and they are doped with similar impurities, similar effects can be attained in both the cases. Besides, although both the embodiments performed the selective doping, both the active layer and the barrier layer may well be doped uniformly.

Figure 4:
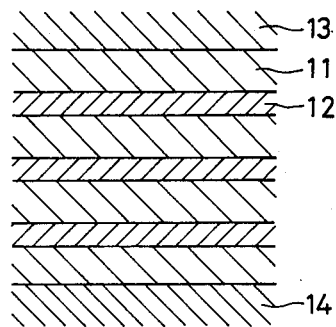
FIGS. 4-6 are sectional views of multiple quantum well structures illustrative of the present invention.
Figure 5:
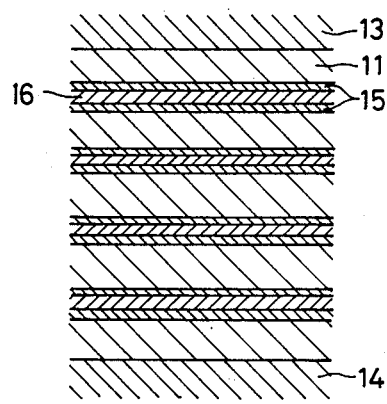
Figure 6:
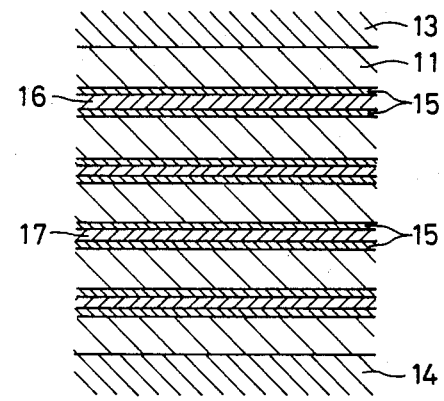

FIGS. 4–6 are sectional views of multiple quantum well structures illustrative of the present invention.

In particular, FIG. 4 shows a device wherein the active layer where the carriers exist is not doped but only a barrier layer is selectively doped, the two-dimensionality of the carriers is not deteriorated, and the high-speed modulation characteristics can be improved.

FIG. 5 shows a structure in which, in the barrier layer, several atomic layers lying in contact with the active layer are left undoped, while the central region of the barrier layer is of the p-type or n-type.

FIG. 6 shows a device wherein the central regions of the barrier layers are selectively doped, so that they are put into the n-type on the side of a p-type cladding layer and into the p-type on the side of n-type cladding layer.

Figure 7A:
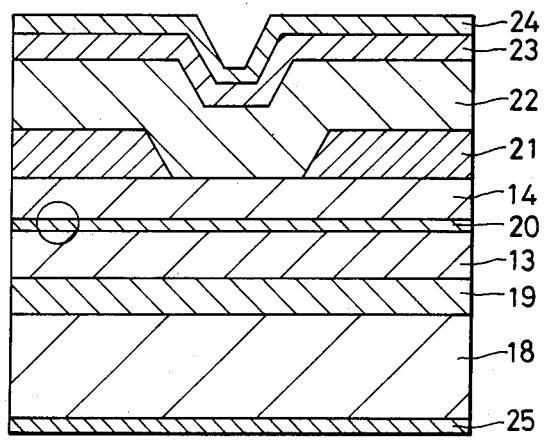
FIGS. 7a and 7b, 8a and 8b, 9a and 9b, and 10a and 10b are sectional views of semiconductor lasers showing embodiments of the present invention.
Figure 7B:
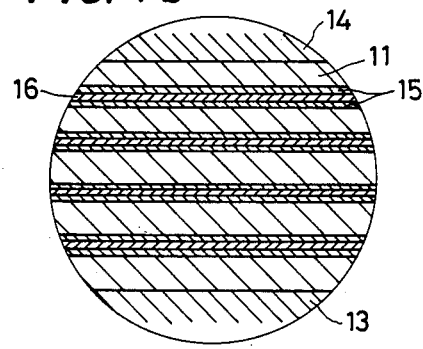

Embodiment 3:

Reference will be had to FIGS. 7a and 7b. FIG. 7b shows, in more detail, the circled portion including the multiple quantum well active region 20 shown in FIG. 7a.

Using the MOCVD (metal-organic chemical vapor deposition), there were successively formed on an n-type GaAs substrate crystal 18 an n-type GaAs buffer layer 19, an n-type $Ga_{1-x}Al_xAs$ cladding layer 13 (x=0.45), a multiple quantum well active region 20 in which five undoped GaAs active layers 11 having a thickness of 70 Å were formed alternately with four barrier layers each being so formed that a p—$Ga_{0.7}Al_{0.3}As$ layer 16 doped with $2 \times 10^{18}$ (cm$^{-3}$) of Mg and having a thickness of 20 Å was sandwiched between undoped $Ga_{0.7}Al_{0.3}As$ layers 15 having a thickness of 10 Å, a p-type $Ga_{1-x}Al_xAs$ cladding layer 14, and an n-type GaAs light absorption layer 21. The middle part of the n-type GaAs layer 21 was completely removed by photoetching, to form a groove stripe 1–15 μm wide exposing the surface of the p-type $Ga_{1-x}Al_xAs$ cladding layer 14. Subsequently, a p-type $Ga_{1-x}Al_xAs$ cladding layer 22 (x=0.45) and a p-type GaAs capping layer 23 were formed by the MOCVD. A p-side electrode 24 and an n-side electrode 25 were thereafter formed, whereupon a laser having a resonator length of about 300 μm was obtained by cleavage. Herein, when the thickness of the p-type $Ga_{0.55}Al_{0.45}As$ layer 14 is 0.1–0.5 μm, the waveguide structure becomes the index-guide structure, and the transverse mode during high-speed modulation can be stabilized.

The device manufactured for trial oscillated continuously at the room temperature with a threshold current of 10–25 mA at a wavelength of 830 nm, the lasing spectrum exhibited a single longitudinal mode, and a stable transverse mode oscillation having no kink up to an optical power of 70 mW was attained. When the laser was biased to an optical power of 60 mW and subjected to small signal direct modulation, a favorable characteristic reaching 15 GHz (3 dB down) was attained as the modulation frequency. As a lifetime in a fixed optical power operation of an optical power of 60 mW at 70° C., any conspicuous deterioration was not noted even after lapse of 2000 hours, and a high reliability was verified. Further, as multiple quantum well structure other than mentioned above, substantially the same high-speed modulation characteristics were attained in all the combinations of $Ga_{1-W}Al_WAs$ well active layers in which the mol ratio W of Al was 0–0.2, each of which had a thickness of 30–150 Å and the number of which was 2–10, and $Ga_{1-B}Al_BAs$ barrier layers in which the mol ratio B of Al was 0.2–0.5 (subject to B>W) and in each of which a sideward undoped barrier layer was 2.8–30 Å thick while a p-type barrier layer being a center region was 5–50 Å thick.

Figure 8A:
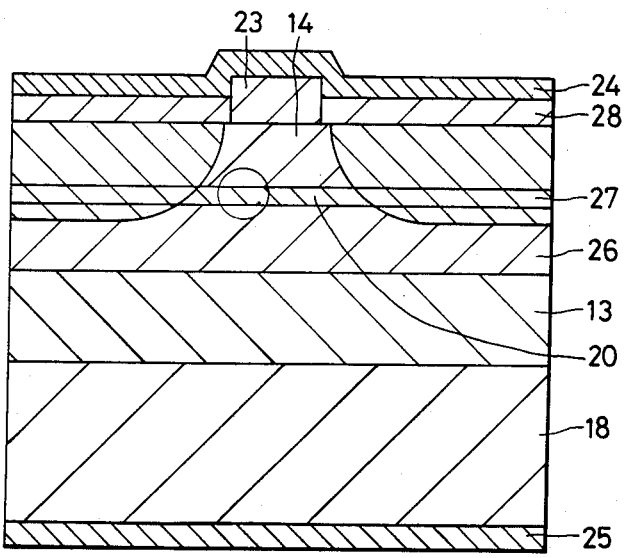
Figure 8B:
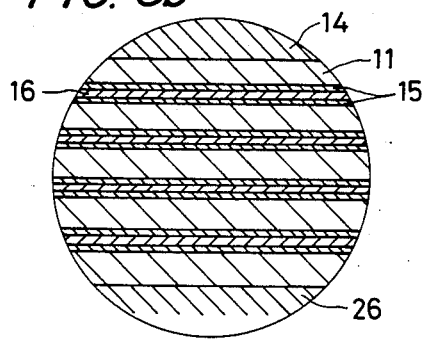

Embodiment 4:

Reference will be had to FIGS. 8a and 8b. FIG. 8b shows, in more detail, the circled portion including multiple quantum well active region 20 in FIG. 8a.

Using the MOCVD, there were successively formed on an n-type GaAs substrate 18 an n-type GaAlAs cladding region 13, an n-type GaAlAs light guiding region 26, the same multiple quantum well active layer 20 as in the embodiment of FIG. 7, a p-type GaAlAs cladding layer 14, and a p-type GaAs capping layer 23. The p-type GaAs capping layer was removed by photoetching so as to leave a stripe 1–15 μm wide behind, and Si was ion-implanted into a region outside the p-type GaAs capping layer 23 of the stripe geometry so as to penetrate the active layer 20. Thereafter, $SiO_2$ 28 was deposited outside the p-type GaAs capping layer of the stripe geometry, and a p-side electrode 24 and an n-side electrode 25 were formed. Subsequently, a laser having a resonator length of about 300 μm was obtained by cleavage. With the present embodiment, characteristics similar to those of the embodiment of FIG. 7 were attained. Further, as regards the active layer structure, the range indicated in the embodiment of FIG. 7 was entirely applicable, and similar characteristics were attained.

Figure 9A:
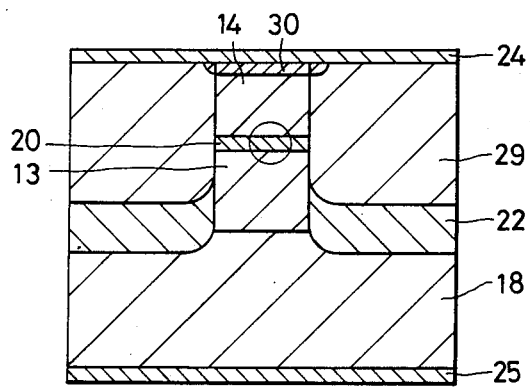
Figure 9B:
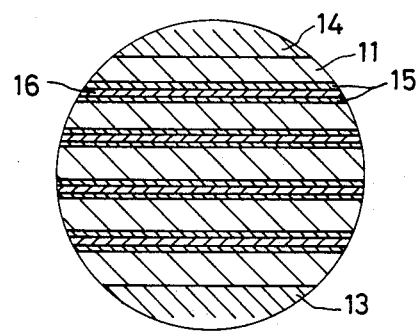
Figure 10A:
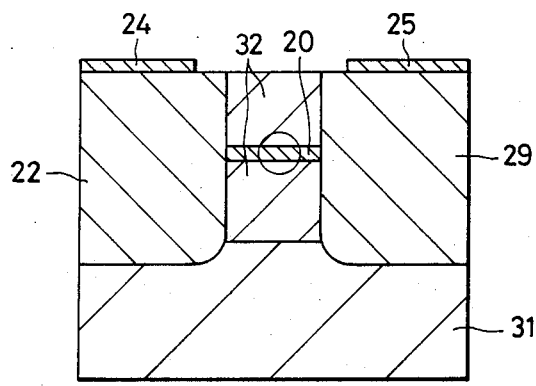
Figure 10B:
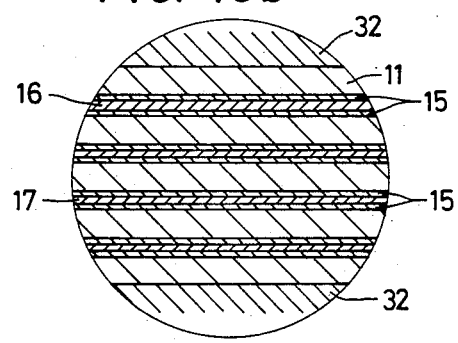

Embodiment 5:

Reference will be had to FIGS. 9a and 9b. FIG. 9b shows, in more detail, the circled portion including multiple quantum well active region 20 shown in FIG. 9a.

An n-type GaAlAs cladding layer 13, the same multiple quantum well active region 20 as in the embodiment of FIG. 7, and a p-type GaAlAs cladding layer 14 were grown on an n-type GaAs substrate 18. Subsequently, the resultant structure was photoetched down to the n-type GaAs substrate 18 so as to leave a stripe 1–5 μm wide behind. Thereafter, a p-type GaAlAs layer 22 and an n-type GaAlAs layer 29 were grown, and a Zn-diffused region 30 was provided. Thereafter, a p-side electrode 24 and an n-side electrode 25 were formed, whereupon a laser having a resonator length of about 300 μm was obtained by cleavage. Also the present embodiment exhibited favorable high-speed modulation characteristics. Since the active region was wholly surrounded with the GaAlAs, the lateral diffusion of carriers was not involved, high-speed characteristics were more excellent and modulation up to 20 GHz was possible. Further, as regards the active layer structure, the range indicated in the embodiment of FIG. 7 was entirely applicable, and similar characteristics were attained.

Embodiment 6:

Reference will be had to FIGS. 9a and 9b. FIG. 9b shows, in more detail, the circled portion including multiple quantum well active region 20 shown in FIG. 9a.

On an insulating GaAs substrate 31, there were formed an undoped GaAlAs layer 32, a multiple quantum well active region 20 wherein three undoped GaAs active layers 11 having a thickness of 70 Å were formed alternately with two barrier layers in each of which an n—$Ga_{0.7}Al_{0.3}As$ layer 17 doped with $2\times10^{18}$ (cm$^{-3}$) and having a thickness of 20 Å was sandwiched between undoped $Ga_{0.7}Al_{0.3}As$ layers 15 having a thickness of 10 Å and wherein two undoped GaAs active layers having a thickness of 70 Å were formed alternately with two barrier layers in each of which a p—$Ga_{0.7}Al_{0.3}As$ layer 16 doped with $2\times10^{18}$ (cm$^{-3}$) of Mg and having a thickness of 20 Å was sandwiched between undoped $Ga_{0.7}Al_{0.3}As$ layers 15 having a thickness of 10 Å, and another undoped GaAlAs layer 32. Thereafter, the grown layers were etched so as to be left in the geometry of a stripe 1–5 μm wide. A p-type GaAlAs buried layer 22 and an n-type GaAlAs buried layer 29 were formed, followed by the formation of a p-side electrode 24 and an n-side electrode 25. Subsequently, a laser having a resonator length of about 300 μm was fabricated by cleavage. This laser had a structure in which carriers were transversely injected into the active region. Further, since the multiple quantum well active region had both p- and n-impurities introduced into the barrier layers, the increment of the gain versus the injected carriers enlarged more, and direct modulation up to 20 GHz was permitted. When this multiple quantum well active region which contained both the p- and n-impurities in the barrier layers was applied to the embodiments shown in FIGS. 7, 8 and 9, similar high-speed modulation characteristics were attained. Even when Be was applied as the p-type impurity and Si as the n-type impurity in the respective embodiments, similar results were obtained.

Figure 11:
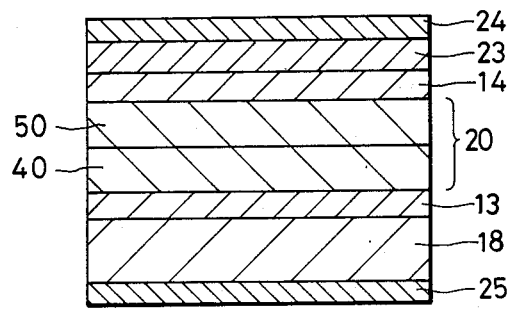
FIG. 11 is a sectional view showing another embodiment of the present invention.

Embodiment 7:

Reference will be had to FIG. 11.

An n-type GaAlAs cladding layer 13 was formed on an n-type GaAs substrate 18. A quantum well active region 20 was formed by growing on the cladding layer 13 a quantum active region in which five p—$Ga_{0.8}Al_{0.2}As$ active layers doped with $1\times10^{17}$ (cm$^{-3}$) of Mg and four p—$Ga_{0.7}Al_{0.3}As$ barrier layers doped with $2\times10^{18}$ (cm$^{-3}$) of Mg were alternately stacked, and then a quantum active region 50 in which four p—$Ga_{0.8}Al_{0.2}As$ active layers doped with $1\times10^{17}$ (cm$^{-3}$) of Se and four p—$Ga_{0.7}Al_{0.3}As$ barrier layers doped with $1\times10^{19}$ (cm$^{-3}$) of Se were alternately stacked. On the resultant structure, a p-type GaAlAs cladding layer 14 and a p-type GaAs capping layer 23 were successively formed by the MOCVD. Thereafter, a stripe geometry was formed in the same way as in Embodiment 4, and electrodes 24 and 25 were formed, to obtain a semiconductor laser. This laser had a modulation speed of 15 GHz.

Embodiment 8:

Using the MOCVD, there were successively formed on an n-type GaAs substrate an n-type GaAlAs cladding layer 13, a quantum well active region wherein five undoped GaAlAs active layers having a thickness of 40 Å were stacked alternately with four barrier layers each made up of an undoped $Ga_{0.7}Al_{0.3}As$ film having a thickness of 10 Å, a p—$Ga_{0.7}Al_{0.3}As$ film having a thickness of 30 Å and an undoped $Ga_{0.7}Al_{0.3}As$ film having a thickness of 10 Å which were successively stacked and wherein a barrier layer which consisted of an undoped $Ga_{0.7}Al_{0.3}As$ film having a thickness of 10 Å and a p—$Ga_{0.7}Al_{0.3}As$ film having a thickness of 20 Å, and an undoped GaAlAs active layer were further stacked thereon, and a p-type GaAlAs cladding layer. The other points were the same as in Embodiment 4. The characteristics of a semiconductor laser thus fabricated were similar to those of Embodiment 3.

Embodiment 9:

After an n-type cladding layer was formed on a GaAs substrate, a quantum well active region was formed thereon wherein five undoped active layers were stacked alternately with four barrier layers in each of which a one-atom layer (that is, a layer one atom in thickness) lying in contact with the well layer was undoped whereas the other part was rendered the p-type. A p-type cladding layer was formed on the active layer. The other points were the same as in Embodiment 4. The modulation speed of a semiconductor laser thus obtained was 13 GHz.

Figure 12:
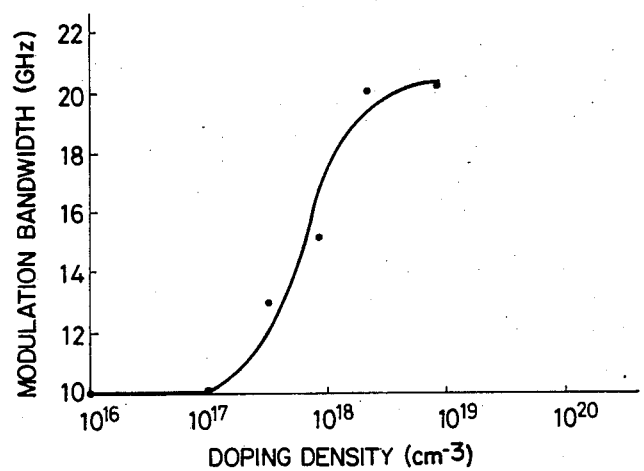
FIG. 12 is a graph for explaining an effect of the present invention.

As to the semiconductor lasers of the foregoing embodiments, samples were fabricated by varying the quantity of doping. Then, the effect of the present invention was remarkably demonstrated from a doping quantity of $5\times10^{17}$ (cm$^{-3}$) (refer to FIG. 12). However, when the quantity of doping reached $2\times10^{19}$ (cm$^{-3}$), crystal lattices increased and no semiconductor laser was obtained.

What is claimed is:

1. A semiconductor laser comprising:
   a semiconductor substrate;
   a plurality of semiconductor layers formed on said semiconductor substrate, including a first cladding layer of a first conductivity type,
   an active region formed on said first cladding layer, said active region having a quantum well structure, the active region having at least a portion thereof doped with impurities at an impurity density of not less than $1\times10^{18}$ cm$^{-3}$,
   a second cladding layer acting with said first cladding layer to sandwich said active region, said second cladding layer being of a second conductivity type opposite the first conductivity type, and
   a resonant cavity formed in said semiconductor layers, said resonant cavity including said active region; and
   a pair of electrodes for injecting carriers so as to make the active region emit light.

2. A semiconductor laser as claimed in claim 1, wherein said active region consists of an active layer whose thickness is less than the de Broglie wavelength of electrons, and said impurities are doped into said active layer.

3. A semiconductor laser as claimed in claim 1, wherein said active region comprises active layers alternating with barrier layers so as to form the quantum well structure.

4. A semiconductor laser as claimed in claim 3, wherein the portion doped with impurities is said barrier layers only.

5. A semiconductor laser as claimed in claim 3, wherein the portion doped with impurities is said active layers only.

6. A semiconductor laser as claimed in claim 3, wherein the impurities are doped into said active region uniformly.

7. A semiconductor laser as claimed in claim 1, wherein the portion of the active region doped with impurities has acceptor impurities therein.

8. A semiconductor laser as claimed in claim 1, wherein the portion of the active region doped with impurities has donor impurities therein.

9. A semiconductor laser as claimed in claim 4, wherein the active region includes a plurality of barrier layers, and the impurities are doped into at least one of said plurality of barrier layers.

10. A semiconductor laser as claimed in claim 5, wherein the impurities are doped into at least one of said plurality of active layers.

11. A semiconductor laser as claimed in claim 4, wherein each of said barrier layers has a central region, and at least one of said central regions is doped with said impurities.

12. A semiconductor laser as claimed in claim 11, wherein at least one of said central regions which is part of said barrier layers closer to said first cladding layer than to said second cladding layer is of said second conductivity type, and at least one of said central regions which is part of said barrier layers closer to said second cladding layer than to said first cladding layer is of said first conductivity type.

13. A semiconductor laser as claimed in claim 1, wherein the portion of the active region doped with impurities includes, as the impurities, at least one element selected from the group consisting of Mg and Be.

14. A semiconductor laser as claimed in claim 1, further comprising a light absorption layer positioned on the second cladding layer, said second cladding layer being interposed between the active region and the light absorption layer.

15. A semiconductor laser according to claim 1, wherein the plurality of semiconductor layers includes a light guiding layer for guiding light emitted from the active region.

16. A semiconductor laser as claimed in claim 1, wherein the first and second cladding layers, and the active region, are in the form of a stripe on the substrate, with additional semiconductor layers provided on opposed sides of the stripe, and a Zn-diffused region provided over the stripe.

17. A semiconductor laser as claimed in claim 1, wherein the first and second cladding layers, and the active region, are in the form of a stripe on the substrate, with additional semiconductor layers respectively on opposed sides of the stripe, the semiconductor layers on the opposed sides of the stripe respectively being of first and second conductivity type.

18. A semiconductor laser as claimed in claim 3, wherein at least one set of said active layers and barrier layers which are adjacent to said second cladding layer, forming a first portion of the active region, is of the first conductivity type, and the remaining portion of said active region, other than said first portion, is of the second conductivity type.

19. A semiconductor laser as claimed in claim 3, wherein at least one barrier layer, which is adjacent to said second cladding layer, is of the first conductivity type, the other barrier layers are of the second conductivity type, and all of said active layers are undoped.

20. A semiconductor laser comprising:
a semiconductor substrate;
a plurality of semiconductor layers formed on said semiconductor substrate, including a first cladding layer of a first conductivity type,
an active region formed on said first cladding layer, said active region having a quantum well structure, the active region having at least a portion thereof doped with impurities at an impurity density of not less than $1 \times 10^{18}$ cm$^{-3}$,
a second cladding layer acting with said first cladding layer to sandwich said active region, said second cladding layer being of a second conductivity type opposite the first conductivity type,
a light absorption layer on said second cladding layer, said light absorption layer having a central portion thereof removed so as to form a groove stripe exposing a corresponding central portion of the second cladding layer, and
a resonant cavity formed in said semiconductor layers, said resonant cavity including said active region; and
a pair of electrodes for injecting carriers so as to make the active region emit light.

21. A semiconductor laser as claimed in claim 20, wherein said light absorption layer has the first conductivity type.

22. A semiconductor laser as claimed in claim 21, further comprising a clad layer on the light absorption layer and on the exposed portion of the second cladding layer, the clad layer being of the second conductivity type.

23. A semiconductor laser comprising:
a semiconductor substrate;
a plurality of semiconductor layers formed on said semiconductor substrate, including a first cladding layer of a first conductivity type,
a light guiding layer of the first conductivity type formed on the first cladding layer,
an active region formed on said light guiding layer, said active region having a quantum well structure, the active region having at least a portion thereof doped with impurities at an impurity density of not less than $1 \times 10^{18}$ cm$^{-3}$,
a second cladding layer acting with said first cladding layer to sandwich said light guiding layer and said active region, said second cladding layer being of a second conductivity type opposite the first conductivity type,
a capping layer of the second conductivity type, in the form of a stripe, formed on a central portion of the second cladding layer,
an ion-implant region, formed using the capping layer as a mask, extending through the second cladding layer and penetrating the active region, and
a resonant cavity formed in said semiconductor layers, said resonant cavity including said active region; and
a pair of electrodes for injecting carriers so as to make said active region emit light.

24. A semiconductor laser as claimed in claim 23, wherein said ion-implant region is a region formed by ion-implanting Si ions using the capping layer as a mask.

25. A semiconductor laser as claimed in claim 24, further comprising a layer of SiO$_2$ formed on that portion of the second cladding layer not covered by said capping layer.

26. A semiconductor laser comprising:
a semiconductor substrate;
a plurality of semiconductor layers formed on said semiconductor substrate, including a first cladding layer of a first conductivity type,
an active region formed on said first cladding layer, said active region having a quantum well structure, the active region having at least a portion thereof doped with impurities at an impurity density of not less than $1 \times 10^{18}$ cm$^{-3}$, a second cladding layer acting with said first cladding layer to sandwich said active region, said second cladding layer being of a second conductivity type opposite the first conductivity type, and a resonant cavity formed in said semiconductor layers, said resonant cavity including said active region;

said first cladding layer, said active region and said second cladding layer being in the form of a stripe on said substrate, the stripe having opposed sides;

a first further layer, of the second conductivity type, formed on said substrate at both the opposed sides of the stripe;

a second further layer, of the first conductivity type, formed on said first further layer at both the opposed sides of the stripe;

a Zn-diffused region formed in a surface region of said second cladding layer; and a pair of electrodes for injecting carriers so as to make said active region emit light.

27. A semiconductor laser comprising:
a semiconductor substrate;
a plurality of semiconductor layers formed on said semiconductor substrate, including a first cladding layer of a first conductivity type,
an active region formed on said first cladding layer, said active region having a quantum well structure, the active region having at least a portion thereof doped with impurities at an impurity density of not less than $1 \times 10^{18}$ cm$^{-3}$,
a second cladding layer acting with said first cladding layer to sandwich said active region, said second cladding layer being of a second conductivity type opposite the first conductivity type, and
a resonant cavity formed in said semiconductor layers, said resonant cavity including said active region;
said first cladding layer, said active region and said second cladding layer being in the form of a stripe on said substrate, the stripe having opposed sides;
a first further layer, of the second conductivity type, on the substrate and adjacent one of the opposed sides of the stripe;
a second further layer, of the first conductivity type, on the substrate and adjacent the other of the opposed sides of the stripe; and
a pair of electrodes for injecting carriers so as to make said active region emit light.

28. A semiconductor laser according to claim 4, wherein the barrier layers include p-type impurities such that the barrier layers have p-type conductivity.

29. A semiconductor laser according to claim 5, wherein the active layers include p-type impurities such that the active layers have p-type conductivity.

30. A semiconductor laser according to claim 20, wherein the active region includes p-type impurities such that the active region has p-type conductivity.

31. A semiconductor laser according to claim 23, wherein the active region includes p-type impurities such that the active region has p-type conductivity.

32. A semiconductor laser according to claim 26, wherein the active region includes p-type impurities such that the active region has p-type conductivity.

33. A semiconductor laser according to claim 27, wherein the active region includes p-type impurities such that the active region has p-type conductivity.

34. A semiconductor laser comprising:
a semiconductor substrate;
a semiconductor layers stacked structure on the semiconductor substrate, the semiconductor layers stacked structure including a resonant cavity which includes an active region, wherein the active region has a quantum well structure, and wherein at least a portion of the active region is doped with impurities at an impurity density of not less than $1 \times 10^{18}$ cm$^{-3}$; and
a pair of electrodes for injecting carriers so as to make the active region emit light.

35. A semiconductor laser according to claim 34, wherein the semiconductor layers stacked structure has a light guiding layer for guiding light emitted from the active region.

36. A semiconductor laser according to claim 35, wherein the light guiding layer is included in the resonant cavity.

37. A semiconductor laser as claimed in claim 34, wherein the quantum well structure has active layers alternating with barrier layers so as to form the quantum well structure.

38. A semiconductor laser as claimed in claim 14, wherein the light absorption layer has a groove stripe exposing a part of the second cladding layer, with a further cladding layer provided covering the exposed part of the second cladding layer.

39. A semiconductor laser as claimed in claim 37, wherein said active layers are of Ga$_{1-y}$Al$_y$As and the barrier layers are of Ga$_{1-z}$Al$_z$As, with $0 \leq y \leq 0.2$ and $z > y$.

40. A semiconductor laser as claimed in claim 15, wherein the light guiding layer is interposed between the first cladding layer and the active region, the laser further comprising a Si-implanted region extending through the second cladding layer so as to penetrate into the active region.

41. A semiconductor laser as claimed in claim 34, wherein the impurity density of the active region portion doped with impurities is not larger than $2 \times 10^{19}$ cm$^{-3}$.

42. A semiconductor laser as claimed in claim 37, wherein only said barrier layers are doped with the impurities.

43. A semiconductor laser as claimed in claim 37, wherein only said active layers are doped with the impurities.

44. A semiconductor laser as claimed in claim 37, wherein said barrier layers are more highly doped with the impurities than said active layers are.

45. A semiconductor laser as claimed in claim 42, wherein the barrier layers have a central region, and only said central regions are doped with the impurities.

46. A semiconductor laser as claimed in claim 37, wherein conductivity types of said active layers and said barrier layers are different in a direction of stacking the active and barrier layers of said active region.

47. A semiconductor laser as claimed in claim 19, wherein each of said barrier layers has at least one layer portion one atom thick, which layer portion is undoped and lies in contact with one of said active layers.

48. A semiconductor laser as claimed in claim 46, wherein each of said barrier layers has at least one layer portion that is one atom thick, which layer portion is undoped and extends from an interface at which it lies in contact with an active layer, the other portions of each of said barrier layers being of the second conductivity type, and said active layers are undoped.

49. A semiconductor laser as claimed in claim 34, wherein the portion of the active region doped with impurities includes, as the impurities, at least one element selected from the group consisting of Mg and Be.

50. A semiconductor laser according to claim 42, wherein the barrier layers include p-type impurities such that the barrier layers have p-type conductivity.

51. A semiconductor laser according to claim 43, wherein the active layers include p-type impurities such that the active layers have p-type conductivity.

* * * * *